United States Patent [19]
Mitsui

[11] Patent Number: 5,849,439
[45] Date of Patent: Dec. 15, 1998

[54] METHOD FOR PREPARING PHASE SHIFT MASK BLANK, AND PHASE MASK

[75] Inventor: Masaru Mitsui, Mukawa-mura, Japan

[73] Assignee: Hoya Corporation, Japan

[21] Appl. No.: 780,123

[22] Filed: Dec. 26, 1996

[30]   Foreign Application Priority Data

Dec. 27, 1995 [JP] Japan ................................. 7-341322

[51] Int. Cl.⁶ ....................................................... G03F 9/00
[52] U.S. Cl. ................................................. 430/5; 428/432
[58] Field of Search ............................... 430/5, 311, 313; 428/432

[56]   References Cited

U.S. PATENT DOCUMENTS 5,429,897  7/1995  Yoshioka et al. ............................ 430/5
5,620,815  4/1997  Ito et al. ..................................... 430/5

*Primary Examiner*—S. Rosasco
*Attorney, Agent, or Firm*—Edward D. Manzo; Mark J. Murphy

[57]   ABSTRACT

A light semitransmittable film of a half tone type phase shift mask blank is formed from a thin film comprising a material including oxygen, nitrogen, silicon and a metal as main constitutional components. In this case, the above-mentioned thin film is formed on a transparent substrate by a reactive sputtering process using a mixed target of molybdenum and silicon. At this time, a mixed gas of an inert gas and nitrous oxide is allowed to flow as an atmosphere gas, and the flow rate of the nitrous oxide gas is controlled within the range of 25 sccm or less to adjust the flow rate, whereby transmittance and film thickness can be controlled.

22 Claims, 5 Drawing Sheets

FIG.1

| SAMPLE No. | OXYGEN CONTENT at% | NITROGEN CONTENT at% | TRANSMITTANCE (i RAYS) |
|---|---|---|---|
| 1 | 40 | 0 | 5 |
| 2 | 45 | 0 | 10 |
| 3 | 50 | 0 | 15 |
| 4 | 40 | 18 | 3 |
| 5 | 45 | 20 | 7 |
| 6 | 50 | 22 | 10 |
| 7 | 55 | 17 | 15 |
| 8 | 60 | 13 | 18 |

FIG.9

| | TRANSMITTANCE % | FILM THICKNESS (Å) | REFRACTIVE INDEX |
|---|---|---|---|
| EXAMPLE 1 | 4 | 1495 | 2.22 |
| EXAMPLE 2 | 6 | 1600 | 2.14 |
| EXAMPLE 3 | 8 | 1705 | 2.07 |

METHOD FOR PREPARING PHASE SHIFT MASK BLANK, AND PHASE MASK

BACKGROUND OF THE INVENTION

1. Field of the Invention

The present invention relates to a method for preparing a phase shift mask blank capable of improving the resolution of a transfer pattern by imparting a phase difference between exposure lights passed through a mask, and a phase shift mask formed from the phase shift mask blank. More specifically, the invention relates to a method for preparing a so-called half tone type phase shift mask blank, and a phase shift mask using this phase shift mask blank.

2. Description of the Related Art

In the manufacture or a semiconductor LSI or the like, a phase shift mask has been used as one of photo masks for a fine pattern transfer. In this phase shift mask, the resolution of the transfer pattern can be improved by imparting a phase difference between exposure lights passed through the mask. As one of such phase shift masks, a so-called half tone type phase shift mask has been known. In this half tone type phase shift mask, a light semitransmittable portion is provided with both of a light intercepting function of substantially intercepting the exposure light and a phase shift function of inverting the phase of the light.

In this half tone type phase shift mask, a mask pattern formed on a transparent substrate comprises a light transmittable portion through which a light having such an intensity as to substantially contribute to the exposure is transmitted, and a light semitransmittable portion through which a light having such an intensity as not to substantially contribute to the exposure is transmitted. Furthermore, this half tone type phase shift mask is constituted so as to have a relation substantially inverting to the phase of the light passed through this light semitransmittable portion, so that the lights passed through the neighborhood of a boundary between the light transmittable portion and the light semitransmittable portion can be mutually offset and the contrast of the boundary can be successfully maintained.

In the half tone type phase shift mask, it is necessary that the light semitransmittable portion is provided with an appropriate function required for both of a light transmittance and the performance of the phase shift. Heretofore, the phase shift mask which can realize the light semitransmittable portion having the appropriate value has been suggested in Japanese Patent Application Laid-open No. 332152/1994. According to this prior art, the light semitransmittable portion comprises a thin film consisting of a material including oxygen, a metal and silicon as main constitutional components or a thin film consisting of the material further including nitrogen in addition to oxygen, the metal and silicon.

This prior art is provided with the following characteristics. That is to say, the content of oxygen ($O_2$) or the content of oxygen ($O_2$) and nitrogen ($N_2$) can be selected so as to control the transmittance, and the adjustment of the thickness of the thin film permits the control of a phase shift quantity. Moreover, the light semitransmittable portion comprises the thin film consisting of the material including oxygen, the metal and silicon as the main elements or the thin film consisting of the material further including nitrogen in addition to oxygen, the metal and silicon, so that the light semitransmittable portion can be constituted of a single layer film consisting of one kind of material. Accordingly, as contrasted to another light semitransmittable portion comprising a multi-layer film consisting of different materials, it is possible to simplify a film formation process and to use a single etching medium. In consequence, a process for manufacturing the phase shift mask blank can be simplified.

However, in such a prior art, as described above, the light semitransmittable portion of the phase shift mask is required to have a predetermined light transmittance on one hand, and a predetermined phase shift quantity on the other hand.

Of these requirements, in general, the light transmittance to the exposure light of the light semitransmittable film comprising the light semitransmittable portion is suitably in the range of 2 to 20%. In order to control the predetermined light transmittance within this range, it is necessary that when the light semitransmittable film is formed with the thin film consisting of the material including oxygen, silicon and the metal as the main constitutional components or the thin film consisting of the material further including nitrogen in addition thereto, the oxygen ($O_2$) content or the nitrogen ($N_2$) content in the thin film should be selected as shown in FIG. 1. The selection of the oxygen ($O_2$) content or the nitrogen ($N_2$) content in the thin film depends on the process of forming the light semitransmittable film.

The semitransmittable film consisting of the material including oxygen, silicon and the metal as the main elements or the semitransmittable film consisting of the material further including nitrogen in addition thereto can be formed as follows. In the case of the thin film consisting of the material including oxygen, silicon and the metal as the main elements, a mixed target of molybdenum (Mo) and silicon (Si) (Mo:Si=1:2 mol %) is used. In a mixed gas atmosphere of argon (Ar) and oxygen ($O_2$) (Ar: 80 to 90%, $O_2$: 10 to 20%, and pressure; $1.5 \times 10^{-3}$ Torr), the film having a predetermined thickness is formed on the transparent substrate by a reactive sputtering process. Furthermore, in case of the thin film containing the material further including nitrogen as the main constitutional components, a mixed target of molybdenum (Mo) and silicon (Si) (Mo:Si=1.2 mol %) is used. In the gas atmosphere of argon (Ar) and nitrous oxide ($N_2O$) (Ar: 72 to 84%, $N_2O$: 16 to 28%, and pressure: $1.5 \times 10^{-3}$ Torr), the film having a predetermined thickness is formed on the transparent substrate by the reactive sputtering process. In this case, in place of $N_2O$, nitrogen monoxide (NO) gas may be used. Thus, when MoSi is used as the material in order to form the light semitransmittable film, the film formation depends largely on the flow rate of a gas comprising an inactive gas and an active gas in a film formation chamber.

Accordingly, in order to select the oxygen ($O_2$) content or the nitrogen ($N_2$) content in the thin film, it is necessary to control the flow rate of the mixed gas, especially, the active gas in the mixed gas, and thus it is preferred that its control is easy. However, the oxygen ($O_2$) content or the nitrogen ($N_2$) content in the thin film is not always correlated with the flow rate of the $O_2$ gas or the $N_2$ gas. With regard to this point, in a conventional technique, transmittance properties to the flow rate of the active gas have not been sufficiently investigated.

Furthermore, in order to continuously carry out the whole process which comprises forming the light semitransmittable film on the transparent substrate to prepare the phase shift mask blank, and exposing, developing, and then etching the phase shift mask blank to obtain the phase shift mask, it is preferred that the formation of the light semitransmittable film is also continuously carried out. In the conventional technique, however, the transparent substrate fed from a previous step at a constant delivery velocity is required to be stopped once in the film formation chamber to accomplish the film formation. Accordingly, the phase shift mask blank as well as the phase shift mask can not be continuously produced.

SUMMARY OF THE INVENTION

The present invention has been developed to solve the above-mentioned problems, and an object of the present invention is to provide a method for preparing a phase shift mask blank in which when a light semitransmittable film is formed from a material comprising oxygen, nitrogen, silicon and a metal as main constitutional components, the transmittance and the thickness of the light semitransmittable film can easily be controlled and the continuous formation of the film can be accomplished by an in-line system (a passage system), and another object of the present invention is to provide a phase shift mask using this phase shift mask blank.

The first aspect of the present invention is directed to a method for preparing a phase shift mask blank which comprises the step of forming, on a transparent substrate, a light semitransmittable film through which a light having such an intensity as not to substantially contribute to exposure is passed, from a material comprising oxygen, nitrogen, silicon and a metal as main constitutional components in a film formation chamber by a reactive sputtering process using a mixed target of a metal and silicon, wherein a mixed gas of an inert gas and nitrous oxide is allowed to flow through the film formation chamber, and the flow rate of nitrous oxide in the mixed gas is controlled to such a flow rate that the light transmittance, to an exposure light, or the film comprising the material including oxygen, nitrogen, silicon and the metal as the main constitutional components is within a specific range.

The second aspect of the present invention is directed to a phase shift mask using a phase shift mask blank prepared by forming, on a transparent substrate, a light semitransmittable film through which a light having such an intensity as not to substantially contribute to exposure is passed, from a material comprising oxygen, nitrogen, silicon and a metal as main constitutional components in a film formation chamber by a reactive sputtering process using a mixed target of a metal and silicon, said phase shift mask being obtainable by allowing a mixed gas of an inert gas and nitrous oxide to flow through the film formation chamber, and then controlling the flow rate of nitrous oxide in the mixed gas so that the light transmittance, to the exposure light, of the film comprising the material including oxygen, nitrogen, silicon and the metal as the main constitutional components may be within a desired range, thereby preparing the phase shift mask blank, and then subjecting the light semitransmittable film of the thus prepared phase shift mask blank to a patterning treatment to form a pattern comprising a light semitransmittable portion in which a part of the light semitransmittable film is removed and a light transmittable portion through which a light having such an intensity as to substantially contribute to the exposure is passed.

BRIEF DESCRIPTION OF THE DRAWINGS

FIG. 1 is an illustrative view showing a relation between an oxygen content or a nitrogen content in an MoSi film and a transmittance of the film.

FIG. 9 shows the characteristics of a phase shift mask blank film for i rays in Embodiments 1 to 3.

DETAILED DESCRIPTION OF THE PREFERRED EMBODIMENTS

Next, a method for preparing a phase shift mask blank and a phase shift mask using the phase shift mask blank prepared by this method according to the present invention will be described in more detail in accordance with embodiments with reference to attached drawings.

Figure 2:
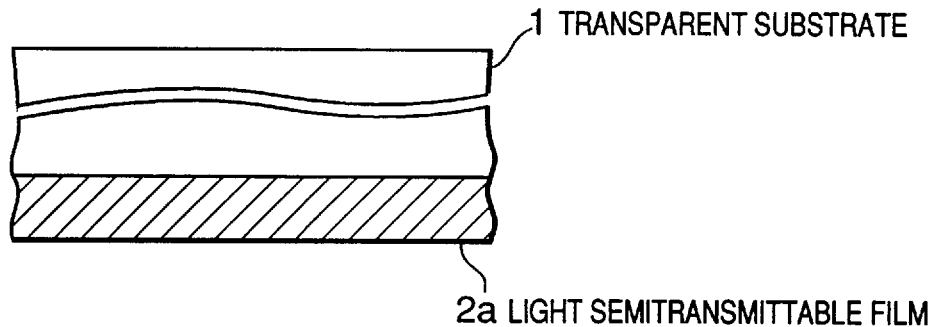
FIG. 2 is a partially sectional view showing the constitution of a phase shift mask blank in an embodiment of the present invention.

FIG. 2 is a partially sectional view showing a phase shift mask blank in an embodiment of the present invention, and a light semitransmittable film 2a is formed on a transparent substrate 1.

Figure 3:
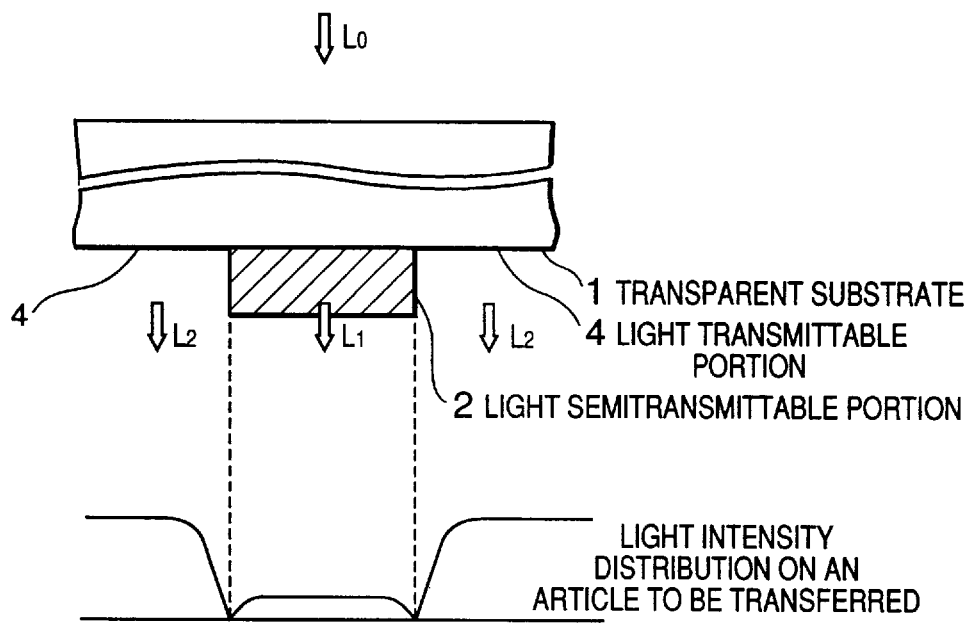
FIG. 3 is a partially sectional view showing the constitution of a phase shift mask in the embodiment of the present invention.

Furthermore, FIG. 3 is a partially sectional view showing a phase shirt mask prepared from the phase shift mask blank shown in FIG. 2.

Next, the phase shift mask blank and the phase shift mask regarding the present invention will be described in detail.

In FIG. 3, reference numeral 1 is a transparent substrate, numeral 2 is a light semitransmittable film formed on this transparent substrate 1, and 4 is a light transmittable portion. The transparent substrate 1 is a quartz glass substrate having main mirror-polished surfaces (front and back surfaces) (size: length=5 inches, width=5 inches, and thickness=0.09 inch).

Here, the light semitransmittable film 2 is a thin film formed from a material comprising oxygen, silicon and a metal as main constitutional components, or a thin film formed from a material comprising oxygen, silicon, a metal and nitrogen as the main constitutional components. Concretely, the light semitransmittable film 2 is formed from a material comprising a metal silicide, an oxide and a nitride or a nitrogen oxide. More concretely, the light semitransmittable film 2 is formed from a material comprising a combination of a compound of oxygen and silicon, a compound of molybdenum and oxygen, a metal silicide of molybdenum and silicon, single molybdenum, a compound of molybdenum, silicon and nitrogen, and a compound of silicon and a nitrogen oxide.

It is desirable that the transmittance of this light semitransmittable film 2 to an exposure light is usually in the range of 2 to 20%. The control of the transmittance within this range can be achieved by the following procedure. That is to say, when the MoSi film is formed on the transparent substrate with the aid of a reactive sputtering process, an inert gas which can be added to an Ar gas is selected from an $O_2$ gas, an $N_2O$ gas, an NO gas and the like, and a flow rate of this inert gas is selected. However, in order to control the transmittance within the desired range, the transmittance characteristics to tho flow rate of the above-mentioned inert gas have been indefinite.

Figure 4:
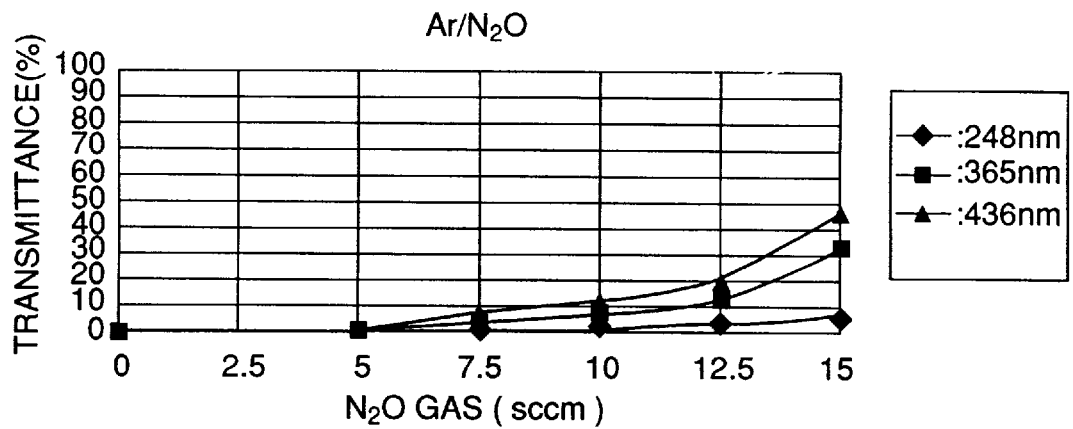
FIG. 4 shows the transmittance characteristics of the MoSi film to the flow rate of an $N_2O$ gas at a time when the $N_2O$ gas is added to an Ar gas in the embodiment of the present invention.
Figure 5:
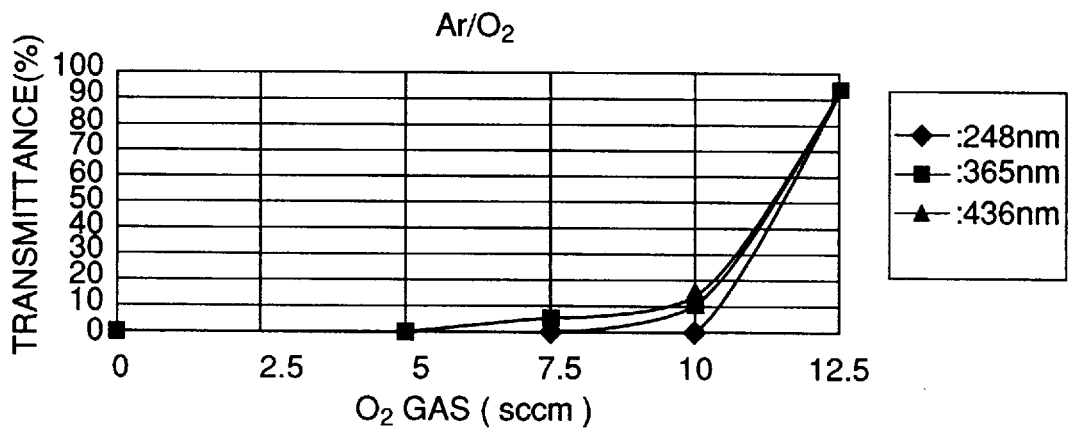
FIG. 5 shows the transmittance characteristics of the MoSi film to the flow rate of an $O_2$ gas at a time when the $O_2$ gas is added to the Ar gas in the embodiment of the present invention.
Figure 6:
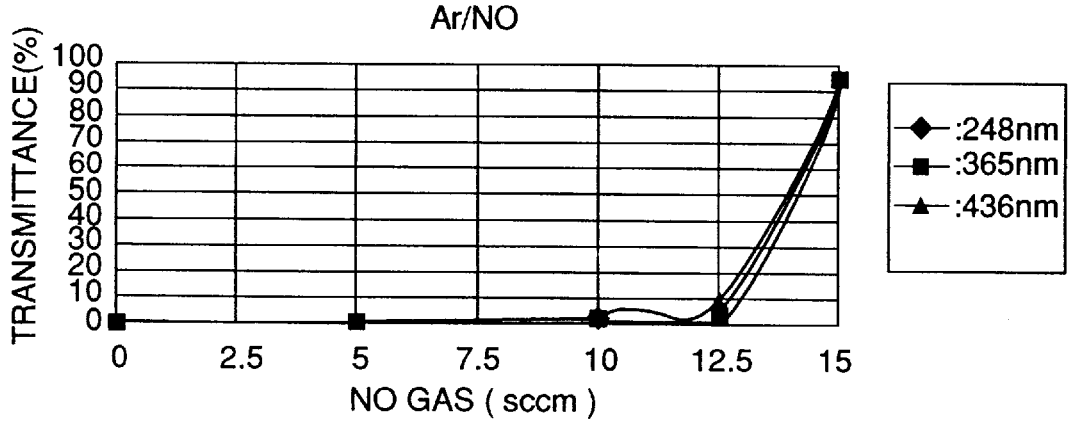
FIG. 6 shows the transmittance characteristics of the MoSi film to the flow rate of an NO gas at a time when the NO gas is added to the Ar gas in the embodiment of the present invention.

Thus, in the present embodiment, the following experiment was carried out to confirm the transmittance characteristics. In the experiment, the change of the transmittance of the exposure light was inspected by altering the flow rate of each of the $O_2$ gas, the $N_2O$ gas and the NO gas, and FIGS. 4 to 6 show the results of the experiment. At this time, as the conditions of the film formation, a mixed target of MoSi (Mo:Si ratio=1:2 mol %) was used, the flow rate of the Ar gas was 60 scam, and the pressure of a mixed gas atmosphere was in the range of 1.3 to $1.6 \times 10^{-3}$ Torr. In order to measure the transmittance, three exposure lights having different wavelengths were used. In the drawings, black squares denote the i rays of a mercury vapor lamp (wavelength $\lambda=365$ nm), black triangles denote g rays (wavelength $\lambda=436$ nm), and the black circles denote KrF excimer laser (wavelength $\lambda=248$ nm). Furthermore, the abscissa axis represents the flow rate of the gas (scm), and the ordinate axis represents the transmittance (%) of the exposure light.

As shown in FIGS. 5 and 6, in the case that $O_2$ or NO is used as an active gas, it is apparent that in the vicinity of the upper limit of the usually desirable transmittance, the controllability of the transmittance to the flow rate of the gas is noticeably poor. On the contrary, as shown in FIG. 4, in the case that the $N_2O$ gas is used, such a poor controllability does not occur, and so the smooth control can be achieved even in the case of the exposure light having any wavelength, and it is apparent that when the $N_2O$ gas is used as the active gas, the controllability of the transmittance is most excellent. Furthermore, when the MoSi film is used as the light semitransmittable portion of the phase shift mask, the transmittance should be practically in the range of 1 to 20%, and hence it has been elucidated that even if the flow rate of the $N_2O$ gas is heightened up to 25 sccm, the transmittance can easily be controlled within the practical range.

Furthermore, a phase shift quantity $\phi$ in the light semitransmittable portion is 180°, and practically, it is $160° \leq \phi \leq 200°$, also in this case, if the flow rate of the active gas in the mixed gas and the film thickness are properly selected, the light semitransmittable film having the thickness corresponding to the practical phase shift quantity can be obtained. However, in obtaining the thickness within the range corresponding to the desired phase shift quantity, the controllability to the kind of active gas has been indefinite.

Figure 7:
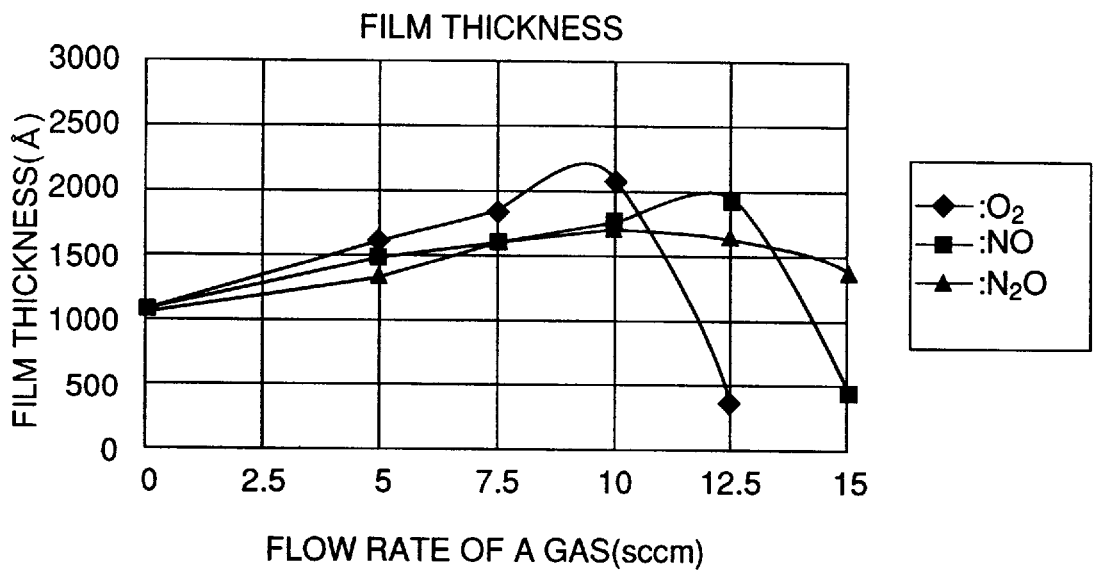
FIG. 7 shows the film thickness characteristics of the MoSi film to the flow rate of each gas at a time when each of $O_2$, NO and $N_2O$ gases is added to the Ar gas in the embodiment of the present invention.

Thus, in order to inspect the controllability of the film thickness, an experiment was carried out in the same manner as described above. FIG. 7 shows the change of the film thickness in the case that the flow rate of each of $O_2$, NO and $N_2O$ gases was altered. Incidentally, the abscissa axis represents the flow rate of the gas (scm), and the ordinate axis represents the film thickness (Å).

In FIG. 7, in the case that $O_2$ or NO is used as the active gas, in the first place, the film thickness linearly increases with the increase of the flow rate of the gas, but when the flow rate at the gas exceeds a certain point, an oxidation degree in a plasma promptly increases, so that a film formation velocity drops and hence the film thickness decreases. Accordingly, when $O_2$ Or NO is used as the active gas, the controllability of the film thickness is not always good. On the contrary, in the case that $N_2O$ is used, the film formation velocity slightly drops during the inspection, but the degree of the velocity drop is much more moderate than in the case that $O_2$ or NO is used. In consequence, it is apparent that when $N_2O$ is used as the active gas, the controllability of the film thickness is excellent.

As understood from the above, when a mixed gas of Ar and $N_2O$ is allowed to flow under conditions that the flow rate of the $N_2O$ gas is 25 scam or less, the phase shift mask blank can be obtained in which the transmittance and the thickness of the light semitransmittable film can easily be controlled. From this phase shift mask blank, the phase shift mask can be prepared. That is to say, a resist film is first formed on the light semitransmittable film of the phase shift mask blank, and a series of known pattern formation treatments containing exposure, development, etching, washing and the like are carried out. Afterward, a part of the light semitransmittable film 2a is removed to obtain the phase shift mask in which the pattern having holes or the pattern having lines and spaces is formed by the light transmittable portion 4 and the light semitransmittable portion 2. In this case, for the etching of the thin film formed from the material comprising oxygen, silicon and a metal as the main constitutional components, or the thin film formed from the material comprising oxygen, silicon, a metal and nitrogen as the main constitutional components, a mixed gas of $CF_4$ and $O_2$ can be used as an etching gas, in the gas, that dry etching is employed.

As shown in FIG. 3, when this phase shift mask is irradiated with an exposure light $L_0$, this exposure light $L_0$ is divided into a light $L_1$ which passes through the light semitransmittable portion 2 and reaches an unshown article to be transferred, and another light $L_2$ which passes through the light transmittable portion 4 and reaches the article to be transferred. In this case, the intensity of the light $L_1$ passed through the light semitransmittable portion 2 is such a weak light that it does not substantially contribute to the exposure. On the other hand, the light $L_2$ passed through the light transmittable portion 4 is such an intensive light which contributes to the exposure, and therefore, by this light $L_2$, the pattern exposure can be carried out. In this case, the lights which pass through the boundary between the light semitransmittable portion 2 and the light transmittable portion 4 mutually invade the other portions by a diffraction phenomenon, but since the phases of both the lights are in a substantially reverse relation, the invaded lights are mutually offset. In consequence, the light intensity on the article to he transferred in the boundary becomes about 0. Accordingly, the boundary becomes extremely definite, whereby resolution can be improved.

Figure 8:
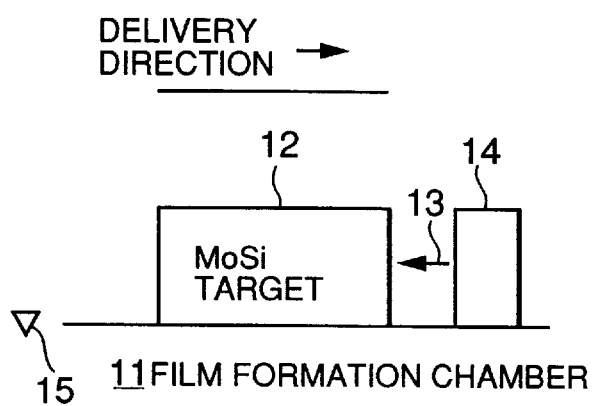
FIG. 8 is a schematic view of an MoSi film forming device which can be used in the embodiment of the present invention.

Next, the controllability of the transmittance and the film thickness will be described. In the first place, the film comprising the material including oxygen, nitrogen, silicon and a metal as the main constitutional components is formed as follows in accordance with an in-line system by the use of the $N_2O$ gas capable of giving such excellent results as described above. FIG. 8 shows a film formation chamber for the phase shift mask blank. A film formation chamber 11 is arranged in a horizontal direction, and an MoSi target 12 is used as a cathode. A mixed gas of Ar and $N_2O$ is fed through a feed orifice 14 arranged on the right side of the cathode, and then exhausted through a vent 15 arranged on the left side of the film formation chamber. The transparent substrate is forwarded in a right direction, and the film is successively formed on the transparent substrate, while it is passed over the target 12.

FIG. 9 shows the film characteristics of the phase shift mask blank for i rays obtained by the above-mentioned in-line system (Embodiments 1 to 3). In Embodiments 1 to 3, the flow rate of the Ar gas is 60 scam, and the flow rates of the $N_2O$ gas are as follows;

Example 1; 11.0 scam

Example 2: 12.3 scam

Example 3: 14.5 scam

Incidentally, in these embodiments, a phase difference is set to 180°.

According to these embodiments, as shown in FIG. 8, the film formation process for the light semitransmittable film is incorporated into the manufacturing line of the phase shift mask blank in which the transparent substrate is treated at a constant delivery velocity, and therefore the film formation process can be accomplished by the serial in-line system.

As described above, when the MoSi film which is the light semitransmittable film is formed with the aid of a reactive sputtering process, the mixed gas of the Ar gas and the $N_2O$ gas is used as the atmospheric gas, and the flow rate of the $N_2O$ gas in this mixed gas is controlled to 25 sccm or less. In consequence, by regulating the flow rate of the $N_2O$ gas within the range of this specific flow rate or less, the transmittance can easily be controlled within a practical range (1 to 20%). As a result, the MoSi film having the desired transmittance can easily be obtained, whereby the phase shift mask blank and hence the phase shift mask can stably be prepared.

In the above-mentioned embodiments, as the metal which is one of the constitutional components of the material constituting the light semitransmittable portion, molybdenum is used, but it is not restrictive. Therefore, tantalum or tungsten may be used. In addition, in place of the Ar gas, there may be used another inert gas such as helium, neon or xenon. Moreover, in the in-line film formation process, the film formation chamber is not limited to a one-stage film formation chamber, and a multi-stage chamber may be used.

Next, the constitution of the present invention will be described.

(Constitution 1)

There is provided a method for preparing a phase shift mask blank regarding the present invention which comprises the step of forming, on a transparent substrate, a light semitransmittable film through which a light having such an intensity as not to substantially contribute to exposure is passed, from a material comprising oxygen, nitrogen, silicon and a metal as main constitutional components in a film formation chamber by a reactive sputtering process using a mixed target of a metal and silicon, wherein a mixed gas of an inert gas and nitrous oxide is allowed to flow through the film formation chamber, and the flow rate of nitrous oxide in the mixed gas is controlled to such a flow rate that the light transmittance, to an exposure light, of the film comprising the material including oxygen, nitrogen, silicon and the metal as the main constitutional components may be within a specific range. Here, the light transmittance is preferably in the range of 2 to 40%, more preferably 3 to 30%.

As understood from the above, when the mixed gas of the inert gas and nitrous oxide is used as the atmosphere gas for use in the reactive sputtering process, it is more compatible with the mixed gas atmosphere within the range of the light transmittance required for the light semitransmittable film, as compared with a case where another mixed is used.

Furthermore, if the flow rate of nitrous oxide in the mixed gas is controlled, the light transmittance, to the exposure light, of the film comprising the material including oxygen, nitrogen, silicon and the metal as the main constitutional components can easily be controlled, thereby obtaining the desired transmittance.

(Constitution 2)

There is also provided a method for preparing a phase shift mask blank regarding the present invention which comprises the step of forming, on a transparent substrate, a light semitransmittable film through which a light having such an intensity as not to substantially contribute to exposure is passed, from a material comprising oxygen, nitrogen, silicon and a metal as main constitutional components in a film formation chamber by a reactive sputtering process using a mixed target of a metal and silicon, wherein a mixed gas of an inert gas and nitrous oxide is allowed to flow through the film formation chamber, and the flow rate of nitrous oxide in the mixed gas is controlled to 25 sccm or less.

If the flow rate of nitrous oxide in the mixed gas is controlled to 25 sccm or less, the light transmittance, to the exposure light, of the film comprising the material including oxygen, nitrogen, silicon and the metal as the main constitutional components which is formed on the transparent substrate can easily be controlled, thereby obtaining the desired transmittance. In this case, if the flow rate of the nitrous oxide gas is in excess of 25 scam, an oxide is deposited on the surface of the target (particularly, a non-erosion portion), so that discharge is unstable and the variate of the transmittance is excessively large, with the result that the controllability of the transmittance is poor. Therefore, it is preferable that the flow rate of nitrous oxide in the mixed gas is regulated to 25 sccm or less.

(Constitution 3)

There is further provided a method for preparing a phase shift mask blank regarding the present invention which comprises the step of forming, on a transparent substrate, a light semitransmittable film through which a light having such an intensity as not to substantially contribute to exposure is passed, from a material comprising oxygen, nitrogen, silicon and a metal as main constitutional components in a film formation chamber by a reactive sputtering process using a mixed target of a metal and silicon, wherein a mixed gas of an inert gas and nitrous oxide is used as an atmosphere in the film formation chamber, and the flow rate of nitrous oxide in the mixed gas is controlled to 25 sccm or less, and the formation of the film comprising the material including oxygen, nitrogen, silicon and a metal as the main constitutional components on the transparent substrate is finally carried out while the transparent substrate is passed over the target.

Since the film is formed while the transparent substrate is delivered in this way, the film formation stop can be incorporated into a series of the phase shift mask blank manufacturing steps in which the transparent substrate is treated while forwarded.

(Constitution 4)

In the method for preparing a phase shift mask blank according to any one of Constitutions 1 to 3, the metal of the film comprising the material containing oxygen, nitrogen, silicon and a metal as the main constitutional components and the metal which is the constitutional component of the mixed target are molybdenum, whereby the feature of Constitution 1 or 2 can be exerted most effectively.

(Constitution 5)

In the method for preparing a phase shift mask blank according to any one of Constitutions 1 to 4, the inert gas is argon.

(Constitution 6)

There is provided a method for preparing a phase shift mask which comprises the steps of preparing a phase shift mask blank by the method for preparing the phase shift mask blank described in any one of Constitutions 1 to 5, and then selectively subjecting a light semitransmittable film of this phase shift mask blank to a patterning treatment to remove a part of the light semitransmittable portion, thereby forming a pattern comprising a light semitransmittable portion and a light transmittable portion through which a light having such an intensity as to substantially contribute to exposure is passed. According to this method, a phase shift mask having the light semitransmittable portion having the desired transmittance.

According to the present invention having the above-mentioned constitution, an atmosphere gas for use in a reactive sputtering process can be used as a mixed gas or an inert gas and nitrous oxide which is compatible with a transmittance, and when the flow rate of nitrous oxide in the mixed gas is controlled so that the light transmittance, to the exposure light, of the film comprising the material including oxygen, nitrogen, silicon and the metal as the main constitutional components may be within the desired range, the light transmittance of the film comprising the material including oxygen, nitrogen, silicon and the metal as the main constitutional components which is the light semitransmittable film can easily be controlled, thereby easily obtaining the transmittance to the wavelength of the exposure light.

Furthermore, according to the present invention, the flow rate of nitrous oxide in the mixed gas is controlled to 25 sccm or less and the flow rate of the gas is regulated within the restricted range, so that the light transmittance of the film comprising the material including oxygen, nitrogen, silicon and the metal as the main constitutional components which is the light semitransmittable film can easily be controlled, thereby easily obtaining the transmittance to the wavelength of the exposure light.

Moreover, according to the present invention, the film is formed on a transparent substrate while the transparent substrate is successively forwarded to a film formation chamber, and therefore the formation of the light semitransmittable film can be accomplished by an in-line system, whereby the continuous preparation of a phase shift mask blank and a phase shift mask can be realized.

In addition, the flow rate of nitrous oxide in the mixed gas which is allowed to flow through the film formation chamber is controlled within the restricted range of 25 sccm or less, so that the thickness of the film comprising the material including oxygen, nitrogen, silicon and the metal as the main constitutional components can easily be controlled, thereby easily obtaining a desired phase shift quantity required to the wavelength of the exposure light.

What is claimed is:

1. A method for preparing a phase shift mask blank comprising the step of forming, on a transparent substrate, a light semitransmittable film, through which a light having such an intensity as not to substantially contribute to exposure can pass, from a material, comprising oxygen, nitrogen, silicon and a metal as main constitutional components, in a film formation chamber by a reactive sputtering process using a mixed target of a metal and silicon, wherein
a mixed gas of an inert gas and nitrous oxide is allowed to flow through the film formation chamber,
and the flow rate of nitrous oxide in the mixed gas is controlled to such a flow rate that the light transmittance, to an exposure light, of the film comprising the material including oxygen, nitrogen, silicon and the material as the main constitutional components is within a specific range.

2. The method for preparing a phase shift mask blank according to claim 1 wherein the flow rate of the nitrous oxide gas is controlled to 25 sccm or less.

3. The method for preparing a phase shift mask blank according to claim 2 wherein the film comprising the material including oxygen, nitrogen, silicon and the metal as the main constitutional components is formed on the transparent substrate by successively and continuously passing the transparent substrate through the film formation chamber.

4. The method for preparing a phase shift mask blank according to claim 1 wherein the metal of the light semitransmittable film and the metal of the mixed target are molybdenum.

5. The method for preparing a phase shift mask blank according to claim 1 wherein the metal of the light semitransmittable film and the metal of the mixed target are tantalum.

6. The method for preparing a phase shift mask blank according to claim 1 wherein the metal of the light semitransmittable film and the metal of the mixed target are tungsten.

7. The method for preparing a phase shift mask blank according to claim 1 wherein the inert gas is argon.

8. The method for preparing a phase shift mask blank according to claim 1 wherein the inert gas is helium.

9. The method for preparing a phase shift mask blank according to claim 1 wherein the inert gas is neon.

10. The method for preparing a phase shift mask blank according to claim 1 wherein the inert gas is xenon.

11. The method of claim 1 wherein said method for preparing a phase shift mask blank is a method for manufacturing a phase shift mask blank.

12. A phase shift mask made using a phase shift mask blank prepared by forming, on a transparent substrate, a light semitransmittable film, through which a light having such an intensity as not to substantially contribute to exposure can pass, from a material, comprising oxygen, nitrogen, silicon and a metal as main constitutional components, in a film formation chamber by a reactive sputtering process using a mixed target of a metal and silicon, said phase shift mask being obtainable by
allowing a mixed gas of an inert gas and nitrous oxide to flow through the film formation chamber, and then controlling the flow rate of nitrous oxide in the mixed gas so that the light transmittance to the exposure light of the film, comprising the material including oxygen, nitrogen, silicon and the metal as the main constitutional components, may be within a desired range, thereby preparing the phase shift mask blank,
and then subjecting the light semitransmittable film of the thus prepared phase shift mask blank to a patterning treatment to form a pattern comprising a light semitransmittable portion and, by removing a part of the light semitransmittable film, a light transmittable portion through which a light having such an intensity as to substantially contribute to the exposure can pass.

13. The phase shift mask according to claim 12 wherein the flow rate of the nitrous oxide gas in the preparation process of the phase shift mask blank is controlled to 25 sccm or less.

14. The phase shift mask according to claim 13 wherein the phase shift mask blank is prepared by successively and continuously passing the transparent substrate through the film formation chamber to form the film comprising the material including oxygen, nitrogen, silicon and the metal as the main constitutional components on the transparent substrate.

15. The phase shift mask according to claim 13 wherein the metal of the light semitransmittable film and the metal of the mixed target are molybdenum.

16. The phase shift mask according to claim 13 wherein the metal of the light semitransmittable film and the metal of the mixed target are tantalum.

17. The phase shift mask according to claim 13 the metal of the light semitransmittable film and the metal of the mixed target are tungsten.

18. The phase shift mask according to claim 13 wherein the inert gas is argon.

19. The phase shift mask according to claim 13 wherein the inert gas is helium.

20. The phase shift mask according to claim 13 wherein the inert gas is neon.

21. The phase shift mask according to claim 13 wherein the inert gas is xenon.

22. A method for preparing a phase shift mask comprising the steps of:

forming a phase shift mask blank by:

forming a light semitransmittable film on a transparent substrate in a film formation chamber by a reactive sputtering process using a mixed target of a metal and silicon, said film being formed from a material comprising oxygen, nitrogen and silicon as main constitutional component and said film being one through which a light having such an intensity as not to substantially contribute to exposure can pass;

allowing a mixed gas, including an inert gas and nitrous oxide to flow through the film formation chamber, and then controlling the flow rate of nitrous oxide in the mixed gas so that the light transmittance of the film to an exposure light is within a desired range, and;

then subjecting the film of the phase shift mask blank to a patterning treatment to form a pattern comprising a light semitransmittable portion and, by removing a part of the semitransmittable portion, a light transmittable portion through which a light having such an intensity as to substantially contribute to exposure can pass.

* * * * *